(12) United States Patent
Yin et al.

(10) Patent No.: US 12,389,533 B2
(45) Date of Patent: Aug. 12, 2025

(54) PRINTED CIRCUIT BOARD (71) Applicant: ZTE CORPORATION, Shenzhen (CN)

(72) Inventors: Changgang Yin, Shenzhen (CN); Zhongmin Wei, Shenzhen (CN); Bi Yi, Shenzhen (CN); Yonghui Ren, Shenzhen (CN)

(73) Assignee: ZTE CORPORATION, Shenzhen (CN)

( * ) Notice: Subject to any disclaimer, the term of this patent is extended or adjusted under 35 U.S.C. 154(b) by 111 days.

(21) Appl. No.: 18/315,589

(22) Filed: May 11, 2023

(65) Prior Publication Data
US 2023/0284375 A1 Sep. 7, 2023

Related U.S. Application Data (63) Continuation of application No. PCT/CN2021/119921, filed on Sep. 23, 2021.

(30) Foreign Application Priority Data

Nov. 19, 2020 (CN) .......................... 202011303587.5

(51) Int. Cl.
*H05K 1/02* (2006.01)
(52) U.S. Cl.
CPC ......... *H05K 1/0251* (2013.01); *H05K 1/0245* (2013.01)
(58) Field of Classification Search
None
See application file for complete search history.

(56) References Cited

U.S. PATENT DOCUMENTS

| 6,891,272 B1* | 5/2005 | Fjelstad | H05K 3/403 257/773 |
| 2005/0133251 A1* | 6/2005 | Chiu | H05K 3/403 174/262 |

(Continued)

FOREIGN PATENT DOCUMENTS

| CN | 1913742 A | 2/2007 |
| CN | 102686007 A | 9/2012 |

(Continued)

OTHER PUBLICATIONS

International Search Report and Written Opinion issued in International Patent Application No. PCT/CN2021/119921; mailed Dec. 22, 2021; 13 pgs.

(Continued)

*Primary Examiner* — Timothy J Thompson
*Assistant Examiner* — John B Freal
(74) *Attorney, Agent, or Firm* — HAUPTMAN HAM, LLP (57) ABSTRACT

The present application relates to a circuit technology, and discloses a printed circuit board, including: a board body portion comprising a plurality of core boards and a plurality of dielectric layers, the plurality of core boards including a plurality of conductor layers, and the plurality of conductor layers including a differential signal transmission layer located on a surface layer of the board body portion and a differential signal line out layer located on an inner layer of the board body portion; two opposite differential signal holes located on the board body portion, the two differential signal holes being passed sequentially from the differential signal transmission layer to the differential signal line out layer through at least a portion of the core boards and connect the differential signal transmission layer to the (Continued)

differential signal line out layer; and two slotted conductive posts located between the two differential signal holes.

10 Claims, 4 Drawing Sheets

(56) References Cited

U.S. PATENT DOCUMENTS

| | | |
|---|---|---|
| 2005/0201065 A1 | 9/2005 | Regnier et al. |
| 2005/0202722 A1 | 9/2005 | Regnier et al. |
| 2008/0093116 A1 | 4/2008 | Lee et al. |
| 2009/0233461 A1 | 9/2009 | Tourne |
| 2017/0094795 A1 | 3/2017 | Stahr et al. |
| 2017/0303391 A1 | 10/2017 | Miyasaka |
| 2020/0404775 A1* | 12/2020 | Chandra .............. H05K 1/0251 |

FOREIGN PATENT DOCUMENTS

| | | |
|---|---|---|
| CN | 106028622 A | 10/2016 |
| CN | 106911023 A | 6/2017 |
| CN | 109195317 A | 1/2019 |
| CN | 109842990 A | 6/2019 |
| JP | 2015056465 A | 3/2015 |
| TW | 200706075 A | 2/2007 |

OTHER PUBLICATIONS

Extended Search Report in Corresponding European Application No. 21893567.4, mailed Apr. 23, 2024; 8 pgs.
First Office Action in Corresponding Chinese Application No. 202011303587.5, dated Mar. 19, 2025; 14 pgs.
Grant Notification in Corresponding Chinese Application No. 202011303587.5, dated Jun. 12, 2025; 6 pgs.

* cited by examiner

PRINTED CIRCUIT BOARD

CROSS-REFERENCE TO RELATED APPLICATIONS

This application is a continuation application of International Application No. PCT/CN2021/119921, filed on Sep. 23, 2021, which claims priority to Chinese Patent Application No. 202011303587.5, filed on Nov. 19, 2020. The disclosures of the above-mentioned applications are incorporated herein by reference in their entireties.

TECHNICAL FIELD

The embodiments of present application relate to the technical field of circuits, and in particular to a printed circuit board.

BACKGROUND

With a rapid development of technology, a high-speed system signal rate reaches gigabytes per second (Gbps), and a research on G+ is initiated. As the signal rate increases to Gbps and above Gbps, the performance of each passive component in the system link becomes critical. The ball grid array package (BGA) differential signal holes are critical passive components in high-speed interconnect channels, and their performance can directly affect the passive performance of the entire link.

In order to increase the signal rate to Gbps and above Gbps, reduce the loss of the printed circuit board and enhance the capacity of the printed circuit board, the dielectric constant of the board selected for manufacturing the printed circuit board is less than 3.0, and the package pitch of the BGA chip, that is, the distance between centers of the two BGA pads, also gradually decreases, and in order to ensure the differential line out, only small differential signal holes can be used.

However, due to a smaller diameter of the differential signal hole, an impedance of the differential signal hole is much larger than an impedance of the differential line connected thereto, the impedance between the differential signal hole and the differential line is not continuous, which leads to an insertion loss, a return loss deterioration and insertion loss fluctuations of the differential signal hole to become larger.

SUMMARY

The embodiment of the present application provides a printed circuit board, including: a board body portion including a plurality of core boards and a plurality of dielectric layers that are parallel to each other and laminated alternately, wherein the plurality of core boards comprise a plurality of conductor layers, and the plurality of conductor layers comprise a differential signal transmission layer located on a surface layer of the board body portion and a differential signal line out layer located on an inner layer of the board body portion; two opposite differential signal holes located on the board body portion, wherein the two differential signal holes are passed sequentially from the differential signal transmission layer to the differential signal line out layer through at least a portion of the core boards and connect the differential signal transmission layer to the differential signal line out layer; and two slotted conductive posts located between the two differential signal holes, wherein the two slotted conductive posts are adjacent to the two differential signal holes respectively, and the two slotted conductive posts are extended from the differential signal transmission layer to the differential signal line out layer.

DETAILED DESCRIPTION OF THE EMBODIMENTS

The main purpose of embodiments of the present application is to propose a printed circuit board, which can make the impedance of the differential signal hole to converge to the impedance of the differential line connected thereto, to improve the impedance continuity between the differential signal hole and the differential line, and then to reduce the insertion loss, return loss deterioration and insertion loss fluctuation of the differential signal hole.

In order to make the purpose, technical solutions and advantages of the embodiments of the present application clearer, each embodiment of the present application will be described in detail below in conjunction with the drawings. However, it will be understood by those skilled in the art that in each embodiment of the present application, many technical details are presented to enable the reader to better understand the present application. However, even without these technical details and various variations and modifications based on each of the following embodiments, the technical solutions protected by the present application can be realized. The following embodiments are divided for the convenience of description and shall not constitute any limitation to the specific implementation of the present application, and each embodiment can be combined and referenced to each other without contradiction.

The first embodiment of the present application relates to a printed circuit board, two slotted conductive posts are provided between two differential signal holes, two slotted conductive posts are adjacent to two differential signal holes respectively, and the two slotted conductive posts extend from the differential signal transmission layer to the differential signal line out layer, to increase the diameter of the differential signal hole in a direction perpendicular to the thickness of the board body portion, to reduce the inductance of the differential signal holes, and thus to reduce the impedance of the differential signal hole, to make the impedance of the differential signal hole to converge to the impedance of the differential line connected thereto, and to improve the impedance continuity between the differential signal hole and the differential line, then to reduce the insertion loss, return loss deterioration and insertion loss fluctuation of the differential signal hole.

The following is a specific description of the details of the printed circuit board of this embodiment. The following is only details provided for ease of understanding and is not necessary to implement this solution.

Figure 1:
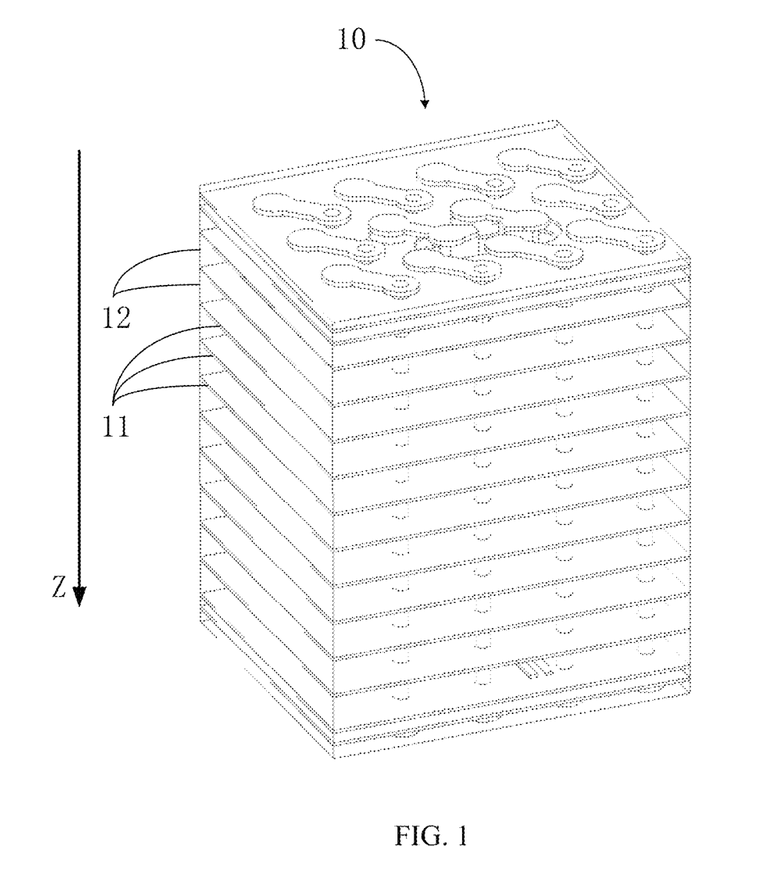
FIG. 1 is a three-dimensional structure view of the printed circuit board according to a first embodiment of the present application.

Referring to FIG. 1, the printed circuit board in this embodiment includes a board body portion 10, the board body portion 10 includes a plurality of core boards and a plurality of dielectric layers 12, the core boards and dielectric layers 12 are parallel to each other and laminated alternately. Each core board includes a plurality of conductor layers. The plurality of conductor layers include a differential signal transmission layer located on a surface layer of the board body portion 10 and a differential signal line out layer located on an inner layer of the board body portion 10. Each dielectric layer 12 includes a dielectric with a dielectric constant less than 3.0 filling its inside. In the embodiment, each core board includes two conductor layers and an intermediate medium located between two conductor layers, and the two conductor layers are a signal layer and a planar layer 11, and the differential signal transmission layer and the differential signal line out layer are both called as signal layer.

The above printed circuit board is applied on high-speed products of Gbps and above Gbps and using BGA chip package with a pitch less than 1.0 mm and requiring differential line out. Further, in this embodiment, the printed circuit board is a rigid board with a thickness of 4 mm. The board body portion 10 is twenty-six conductor layers made of twelve layers of core boards and thirteen dielectric layers 12, the conductor layers and dielectric layers 12 are parallel to each other and laminated alternately. The dielectric layer 12 is used to maintain an insulation of lines in the printed circuit board and an insulation between the core boards, and the differential signal transmission layer (i.e., the signal layer of the first core layer, i.e., the first conductor layer) is located on the surface layer of the board body portion 10, the differential signal line out layer (i.e., the signal layer of the twelfth core boards) is the twenty-third conductor layer, and the dielectric constant of the dielectric filled in the dielectric layer 12 is 2.5.

It should be noted that the board body portion is not limited to the above board body portion with twenty-six conductor layers, and the dielectric constant of the dielectric filled in the dielectric layer can also be other values.

Figure 2:
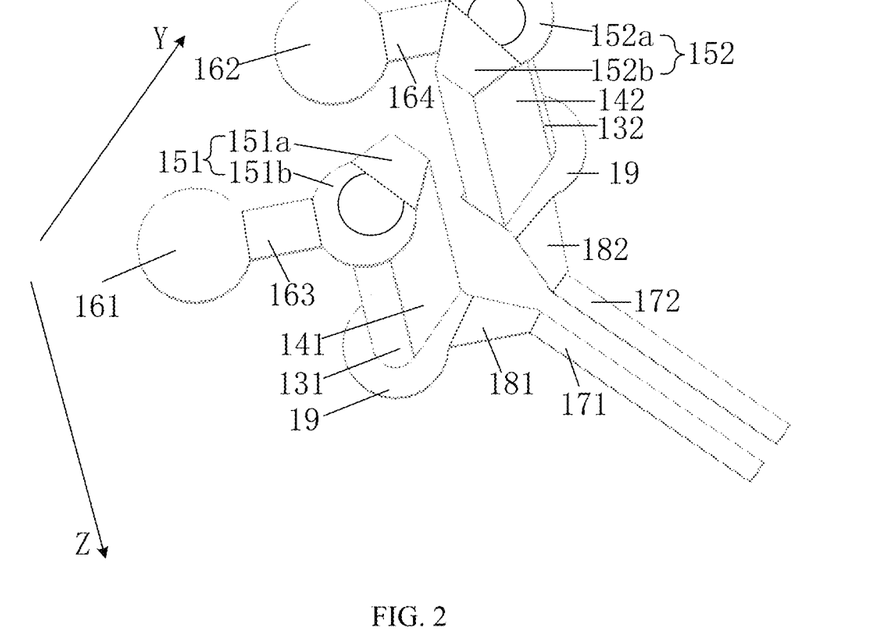
FIG. 2 is a structure view of a remaining printed circuit board shown in FIG. 1 after removing a core board and a dielectric layer.
Figure 3:
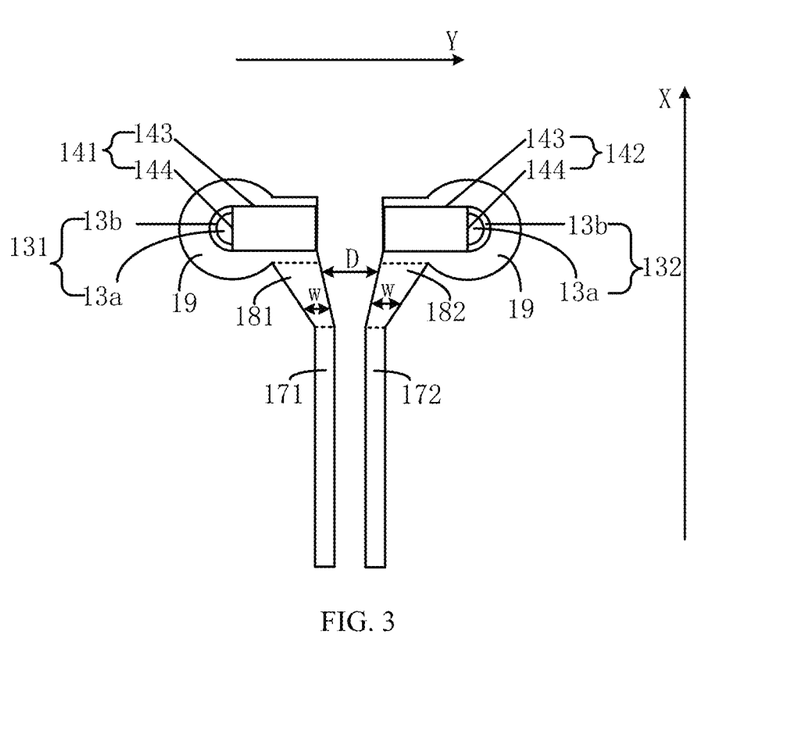
FIG. 3 is a top view of a remaining printed circuit board shown in FIG. 2 after removing two first signal hole pads, two connection portions and two BGA pads.

Referring to FIG. 2 and FIG. 3, the above printed circuit board also includes a first differential signal hole 131 and a second differential signal hole 132 opposite to each other provided on the board body portion 10. The first differential signal hole 131 and the second differential signal hole 132 are passed sequentially from the differential signal transmission layer to the differential signal line out layer through ten layers of core boards, and connect the differential signal transmission layer to the differential signal line out layer. In the embodiment, a drilling diameter of the first differential signal hole 131 and a drilling diameter of the second differential signal hole 132 are 0.15 mm, and the copper is deposited in the hole with the drilling diameter of 0.15 mm to form the first differential signal hole 131 and the second differential signal hole 132 with copper walls, and a distance between centers of the first differential signal hole 131 and the second differential signal hole 132 is 0.8 mm.

The above printed circuit board also includes a first slotted conductive post 141 and a second slotted conductive post 142 located between the first differential signal hole 131 and the second differential signal hole 132. The first slotted conductive post 141 is adjacent to the first differential signal hole 131 and the second slotted conductive post 142 is adjacent to the second differential signal hole 132. Both the first slotted conductive post 141 and the second slotted conductive post 142 extend from the differential signal transmission layer to the differential signal line out layer.

The parasitic inductances L of the first differential signal hole 131 and the second differential signal hole 132 can be calculated using an equation (1) as follows:

$$L = 5.08H[\ln(4H/d)+1] \quad (1)$$

The impedances Z of the first differential signal hole 131 and the second differential signal hole 132 can be calculated by an equation (2) as follows:

$$Z = \sqrt{(L/C)} \quad (2)$$

In the above equations (1) and (2), H is a length of the first differential signal hole 131 and the second differential signal hole 132, d is a diameter of the first differential signal hole 131 and of the second differential signal hole 132, and C is a parasitic capacitance of the first differential signal hole 131 and of the second differential signal hole 132.

In the printed circuit board provided in the embodiment, the first slotted conductive post 141 is adjacent to the first differential signal hole 131, the second slotted conductive post 142 is adjacent to the second differential signal hole 132, and the first slotted conductive post 141 and the second slotted conductive post 142 are extended from the differential signal transmission layer to the differential signal line out layer, so that "d" in above equation (1) when calculated needs to include the cross-section area of the first slotted conductive post 141 adjacent to the first differential signal hole 131 and the cross-section area of the second slotted conductive post 142 adjacent to the second differential signal hole 132 in the direction perpendicular to the thickness of the board body portion 10 (i.e., Z shown in the figure), such that "d" is increased, the parasitic inductance "L" of the first differential signal hole 131 and the second differential signal hole 132 is decreased, to reduce impedance. Without changing the parasitic capacitance C of the first differential signal hole 131 and the second differential signal hole 132, the impedance Z of the first differential signal hole 131 and the second differential hole 132 is reduced, so that the impedance of the first differential signal hole 131 and the second differential signal hole 132 converges to the impedance of the differential line connected thereto, to reduce the insertion loss, return loss deterioration and insertion loss fluctuation of the first differential signal hole 131 and the second differential signal hole 132.

In an embodiment, a shape and a size of a cross-section of each of the first slotted conductive post 141 and the second slotted conductive post 142 are the same at everywhere in a direction perpendicular to a thickness of the board body portion 10. In this way, the impedance of each of the first differential signal hole 131 and the second differential signal hole 132 is the same at every where in each extension direction of the hole, to improve the stability of the data transmission of the first differential signal hole 131 and the second differential signal hole 132.

In an embodiment, the first slotted conductive post 141 and the second slotted conductive post 142 are both a cuboid, and the cross-section of each of the first differential signal hole 131 and the second differential signal hole 132 is a circular hole in the direction perpendicular to a thickness of the board body portion 10. A direction from the first differential signal hole 131 pointing to the second differential signal hole 132 is a first direction (i.e., the Y shown), and the cross-section of each of the first slotted conductive post 141 and the second slotted conductive post 142 is rectangular in the thickness direction of the board body portion 10, that is, the cross-section of each of the first slotted conductive post 141 and the second slotted conductive post 142 includes a long straight edge 143 parallel to the first direction and a short straight edge 144 perpendicular to the first direction. The length of the long straight edge 143 is equal to half of a difference between a distance between centers of the first differential signal hole 131 and the second differential signal hole 132 and a distance between the first slotted conductive post 141 and the second slotted conductive post 142, the first differential signal hole 131 and the second differential signal hole 132 have the same outer diameter, and the length of the short straight edge 144 is not larger than an outer diameter of the circular pad that is located in the inner layer of the printed circuit board and surrounds the first slotted conductive post 141 or the second slotted conductive post 142. In the embodiment, the length of the short straight edge 144 is equal to the outer diameter of the first differential signal hole 131.

In the embodiment, a distance between the centers of the first differential signal hole 131 and the second differential signal hole 132 is 0.8 mm, and a distance between the first slotted conductive post 141 and the second slotted conductive post 142 is 17 mil (mil: one thousandth of an inch); the length of the short straight edge 144 (i.e., the outer diameter of the first differential signal hole 131 or the outer diameter of the second differential signal hole 132) is 6 mil) is 6 mil.

It should be noted that since an impedance difference between the differential signal holes of different printed circuit boards and the differential lines connected thereto is different, thus the impedance difference between the differential signal holes and the differential lines of the BGA can be reduced to a preset interval by adjusting a distance between the two second slotted conductive posts and the length of the short straight edge 144, to reduce the insertion loss, return loss and insertion loss fluctuation of the differential signal hole, to improve the transmission stability of the printed circuit board signal.

Specifically, the above printed circuit board in the embodiment includes two first signal hole pads 151, 152 provided on the surface layer (i.e., differential signal transmission layer) of the board body portion 10 and connected to the first differential signal hole 131 and the second differential signal hole 132, and two BGA pads 161, 162 connected to the first signal hole pads 151, 152, respectively.

In the embodiment, the first signal hole pad 151 includes a main body portion 151a connected to the BGA pad 161 and an extension portion 151b connected to the main body portion 151a. An end of the first differential signal hole 131 is passed through one main body portion 151a and is connected to the main body portion 151a, and an end of the second differential signal hole 132 is passed through another main body portion 152a and is connected to the main body portion 152a. Each of the first slotted conductive post 141 and the second slotted conductive post 142 is connected to an extension portion 151b, 152b at an end adjacent to the differential signal transmission layer. In this embodiment, two connection portions 163, 164 are also included, and each first signal hole pad 151, 152 is connected to the BGA pads 161, 162 through one connection portion 163, 164.

In another embodiment, each of the first differential signal hole 131 and the second differential signal hole 132 includes a hole 13a opened in the board body portion 10 and a conductive copper plating layer 13b provided on a wall of the hole 13a, and each of the first slotted conductive post 141 and the second slotted conductive post 142 is connected to a conductive copper plating layer 13b. In the embodiment, each of the first slotted conductive post 141 and the second slotted conductive post 142 is connected to a conductive copper plating layer 13b, so that the first slotted conductive post 141 is connected to the first differential signal hole 131 as a whole, and the second slotted conductive post 142 is connected to the second differential signal hole 132 as a whole.

In an embodiment, the above printed circuit board in the embodiment also includes a first differential line 171 and a second differential line 172 opposite to each other provided on the differential signal line out layer, a first impedance transition portion 181 and a second impedance transition portion 182 opposite to each other provided on the differential signal line out layer, and two opposite third pads 19 provided on the differential signal line out layer. The first differential line 171 and the first impedance transition portion 181 are connected to the first differential signal hole 131 and the first slotted conductive post 141 through a third pad 19. The second differential line 172 and the second impedance transition portion 182 are connected to the second differential signal hole 132 and the second slotted conductive post 142 through another third pad 19.

In an embodiment, the first differential line 171, the second differential line 172, the first impedance transition portion 181 and the second impedance transition portion 182 all have the same thickness. A width of the first impedance transition portion 181 gradually increases (W as shown) in the direction close to the first differential signal hole 131 (Z as shown), and a width (W as shown) of the second impedance transition portion 182 gradually increases in the direction (X as shown) close to the second differential signal hole 132. In this way, the first impedance transition portion 181 and the second impedance transition portion 182 reduce the impedance of the two third pads 19, to ensure the impedance continuity and enhance their structural strength.

In an embodiment, a distance (D as shown) between the first impedance transition portion 181 and the second impedance transition portion 182 in a direction close to the first differential signal hole 131 and the second differential signal hole 132 (Z as shown) gradually increases. In this way, the distance between the first differential line 171 and the second differential line 172 is reduced, so that the line widths of the first differential line 171 and the second differential line 172 are not too narrow, and the first differential line 171 and the second differential line 172 can exit around a single back hole in the BGA over-hole array, to increase the line density of the printed circuit board. In this embodiment, the distance between the first differential line 171 and the second differential line 172 is 3 mil, and the line width of the first differential line 171 and the second differential line 172 is 3 mil.

Figure 4:
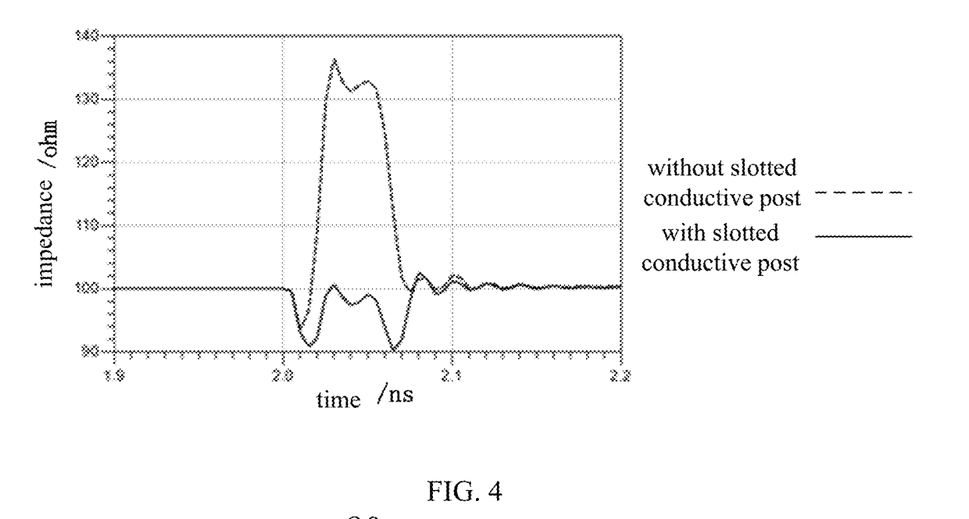
FIG. 4 is a graph of an impedance change effect test data of the printed circuit board with a slotted conductive post according to the first embodiment of the present application, compared to the printed circuit board without a slotted conductive post.

As shown in FIG. 4, a dashed line in the figure is an impedance change curve of the printed circuit board without slotted conductive posts as time varies in the transmission of data. At the time of 2.005 nanoseconds (ns), the impedance of the differential signal hole begins to rise, the impedance reaches a maximum of 135 ohm, and a difference between the impedance before the time of 2.005 ns and the impedance after the time of 2.1 ns reaches a maximum of ohm. The solid line in the figure shows the impedance curve of the printed circuit board with the first slotted conductive post 141 and the second slotted conductive post 142 as time varies in the transmission of data. At the time of 2.005 ns, the impedance between the first differential signal hole 131 and the second differential signal hole 132 begins to fluctuate in a small range, and reaches a minimum of 90 ohm. A difference between the impedance before 2.005 ns and the impedance after 2.1 ns is only 10 ohm, and the impedance fluctuates less when the data is transmitted through the first differential signal hole 131 and the second differential signal hole 132, especially the difference between the impedances from 2.35 ns to 2.55 ns is less than 4 ohm.

Figure 5:
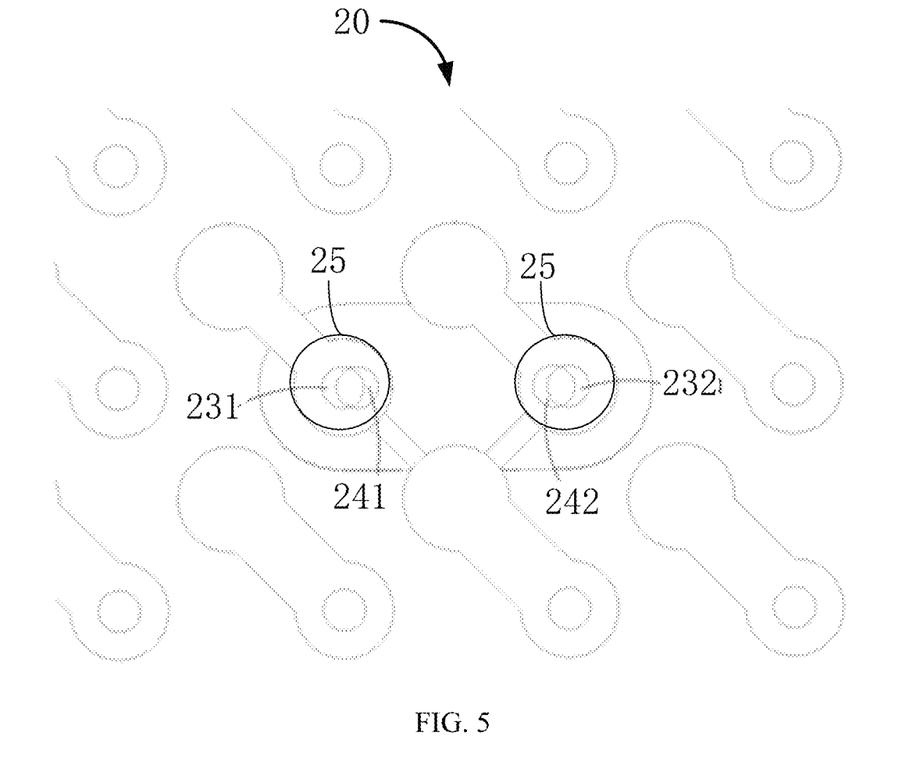
FIG. 5 is a partial schematic view of a surface layer of a board body portion of the according to a second embodiment of the present application.

Referring to FIG. 5, a second embodiment of the present application provides the board body portion 20 of the printed circuit board substantially the same as the above first embodiment, the difference therebetween is that the first slotted conductive post 241 and the second slotted conductive post 242 are cylindrical, and the cross-section of each of the first differential signal hole 231 and the second differential signal hole 232 is a circular hole in the direction perpendicular to the thickness of the board body portion 20.

In an embodiment, the above printed circuit board also includes two first signal hole pads 25 provided on the surface of the board body portion and connected to the first differential signal hole 231 and the second differential signal hole 232 respectively. The cross-section of first signal hole pad 25 is a circular hole in the direction perpendicular to the thickness of the board body portion, and the diameter of each of the first slotted conductive post 241 and the second slotted conductive post 242 is not larger than an outer diameter of the first signal hole pad 25. In this embodiment, the diameter of each of the first slotted conductive post 241 and the second slotted conductive post 242 is the same as the outer diameter of each of the first differential signal hole 231 and the second differential signal hole 232.

Figure 6:
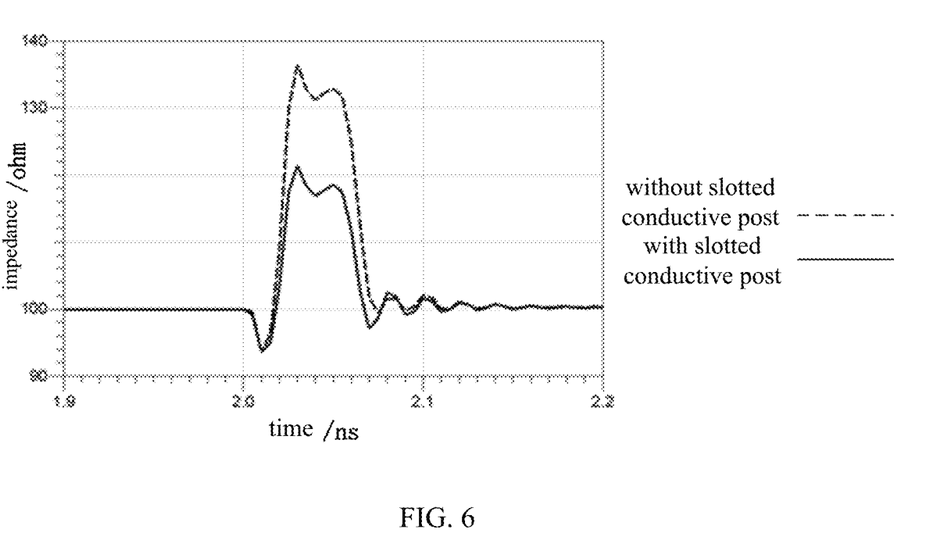
FIG. 6 is a graph of an impedance change effect test data of the printed circuit board with a slotted conductive post according to the second embodiment of the present application compared to the printed circuit board without a slotted conductive post.

As shown in FIG. 6, a dashed line is an impedance curve of the printed circuit board without slotted conductive posts as time varies in the transmission of data, it can be obtained at the time of 2.005 ns, the impedance of the differential signal hole begins to rise, the impedance reaches a maximum of 135 ohm, and a difference between the impedance before the time of 2.005 ns and the impedance after the time of 2.1 ns reaches a maximum of 35 ohm. The solid line in the figure is the impedance curve of the printed circuit board after being provided with the first slotted conductive post 241 and the second slotted conductive post 242 as time varies in the transmission of data, it can be obtained that at the time of 2.005 ns, the impedance of each of the first differential signal hole 231 and the second differential signal hole 232 begins to increase, and the impedance reaches a maximum of 121 ohm, the difference between the impedance before 2.005 ns and the impedance after 2.1 ns is only 21 ohm.

It is understood by those skilled in the art that the above slotted conductive posts are not limited to the cuboid in a first embodiment and the cylinder in a second embodiment of the present application, e.g., the slotted conductive post is a half cylinder, etc. In addition, the above embodiments are specific examples for the realization of the present application, and in practical applications, various changes can be made to them in form and details without deviating from the scope of the present application.

What is claimed is:

1. A printed circuit board, comprising:
a board body portion comprising a plurality of core boards and a plurality of dielectric layers that are parallel to each other and laminated alternately, wherein the plurality of core boards comprise a plurality of conductor layers, and the plurality of conductor layers comprise a differential signal transmission layer located on a surface layer of the board body portion and a differential signal line out layer located on an inner layer of the board body portion;
two opposite differential signal holes located on the board body portion, wherein the two differential signal holes are passed sequentially from the differential signal transmission layer to the differential signal line out layer through at least a portion of the core boards and connect the differential signal transmission layer to the differential signal line out layer;
two slotted conductive posts located between the two differential signal holes, wherein the two slotted conductive posts are adjacent to the two differential signal holes respectively, and the two slotted conductive posts are extended from the differential signal transmission layer to the differential signal line out layer; and
two first signal hole pads provided on the surface layer of the board body portion and connected to the two differential signal holes respectively, and two ball grid array (BGA) pads connected to the two first signal hole pads respectively,
wherein each of the first signal hole pads comprises a main body portion connected to the BGA pad and an extension portion connected to the main body portion, an end of each differential signal hole is passed through the main body portion and connected to the main body portion, and an end of the slotted conductive post adjacent to the differential signal transmission layer is connected to the extension portion.

2. The printed circuit board according to claim 1, wherein a shape and a size of a cross-section of each slotted conductive post are the same at everywhere in a direction perpendicular to a thickness of the board body portion.

3. The printed circuit board according to claim 1, wherein each slotted conductive post is a cuboid, and a cross-section of each differential signal hole is a circular hole in the direction perpendicular to the thickness of the board body portion.

4. The printed circuit board according to claim 3, wherein a direction from one of the two differential signal holes pointing to the other of the two differential signal holes is a first direction, and the cross-section of each slotted conductive post in the direction perpendicular to the thickness of the board body portion comprises a long straight edge parallel to the first direction and a short straight edge perpendicular to the first direction, and a length of the long straight edge is equal to half of a difference between a distance between centers of the two differential signal holes and a distance between the two slotted conductive posts, and a length of the short straight edge is equal to an outer diameter of each differential signal hole.

5. The printed circuit board according to claim 1, wherein each slotted conductive post is cylindrical, and a cross-section of each differential signal hole is a circular hole in the direction perpendicular to the thickness of the board body portion.

6. The printed circuit board according to claim 5,
wherein a cross-section of each first signal hole pad is a circular hole in the direction perpendicular to the thickness of the board body portion, and a diameter of the slotted conductive post is not larger than an outer diameter of the first signal hole pad.

7. The printed circuit board according to claim 1, wherein each differential signal hole comprises a hole opened in the board body portion and a conductive copper plating layer provided on a wall of the hole, and the slotted conductive post is connected to the conductive copper plating layer.

8. The printed circuit board according to claim 1, further comprising:
   two opposite differential lines, two opposite impedance transition portions and two opposite third pads provided on the differential signal line out layer,
   wherein each differential line is connected to one third pad through one impedance transition portion, and each third pad is connected to one differential signal hole and one slotted conductive post.

9. The printed circuit board according to claim 8, wherein a thickness of the impedance transition portion is the same as a thickness of the differential line, and a width of the impedance transition portion gradually increases in a direction close to the differential signal hole connected thereto.

10. The printed circuit board according to claim 8, wherein a distance between the two impedance transition portions gradually increases in a direction close to the two differential signal holes.

\* \* \* \* \*